(12) United States Patent  
Chiang

(10) Patent No.: US 10,487,822 B2  
(45) Date of Patent: Nov. 26, 2019

(54) AIRFLOW GENERATING DEVICE AND AIRFLOW GENERATING METHOD

(71) Applicants: Inventec (Pudong) Technology Corporation, Shanghai (CN); INVENTEC CORPORATION, Taipei (TW)

(72) Inventor: Meng-Lung Chiang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 286 days.

(21) Appl. No.: 15/475,116

(22) Filed: Mar. 30, 2017

(65) Prior Publication Data

US 2018/0128261 A1    May 10, 2018

(30) Foreign Application Priority Data

Nov. 9, 2016    (CN) .......................... 2016 1 0983163

(51) Int. Cl.
*F04B 45/047*    (2006.01)
*H01F 7/06*    (2006.01)
(Continued)

(52) U.S. Cl.
CPC .......... *F04B 45/047* (2013.01); *F04B 7/0049* (2013.01); *F04B 39/10* (2013.01);
(Continued)

(58) Field of Classification Search
CPC ...... F04B 45/047; F04B 49/065; F04B 39/10; F04B 7/0049; F04B 9/045; F04B 13/00;
(Continued)

(56) References Cited

U.S. PATENT DOCUMENTS 9,205,665 B2    12/2015 Kaneko
2006/0147329 A1*    7/2006 Tanner ...................... F04B 7/00
                                                                417/505
(Continued)

FOREIGN PATENT DOCUMENTS

CN    203925955 U    11/2014
EP    0619210 A2    10/1994
(Continued)

*Primary Examiner* — Devon C Kramer
*Assistant Examiner* — Christopher J Brunjes
(74) *Attorney, Agent, or Firm* — CKC & Partners Co., LLC

(57) ABSTRACT

An airflow generating device includes a container, a first air switch, a second air switch, a magnetic oscillating element, and one or more coils. The container has a first opening and a second opening. The first air switch is configured to open or close the first opening. The second air switch is configured to open or close the second opening. The magnetic oscillating element is disposed in the container. The one or more coils are disposed adjacent to the magnetic oscillating element. The one or more coils are configured to generate at least one sensing current corresponding to the oscillation of the magnetic oscillating element, so as to make the first air switch and the second air switch respectively open or close the first opening and the second opening according to the at least one sensing current.

3 Claims, 14 Drawing Sheets

(51) Int. Cl.
*F04B 43/02* (2006.01)
*F04B 39/10* (2006.01)
*F04B 7/00* (2006.01)
*F04B 49/06* (2006.01)
*H05K 7/20* (2006.01)

(52) U.S. Cl.
CPC .............. *F04B 43/02* (2013.01); *F04B 49/06* (2013.01); *F04B 49/065* (2013.01); *H01F 7/064* (2013.01); *H05K 7/20172* (2013.01); *H05K 7/20209* (2013.01)

(58) Field of Classification Search
CPC ........ F04B 17/03; F04B 17/04; F04B 17/042; F04B 2201/0201; F04B 2201/1208; F04B 2203/0213; F04B 43/04; F04B 43/082; F04B 43/02; F04B 43/043; F04B 49/125; F04B 45/04; F04B 35/045; F04B 49/02; F04B 49/20; F04B 2203/0209; F04B 43/046; F04B 19/006; H01F 7/064

USPC ............................................... 222/16, 63, 33
See application file for complete search history.

(56) References Cited

U.S. PATENT DOCUMENTS

| | | | |
|---|---|---|---|
| 2009/0242813 A1* | 10/2009 | Hirata | F16K 31/005 251/129.01 |
| 2010/0173212 A1* | 7/2010 | Senoue | H01M 8/04186 429/432 |
| 2016/0157035 A1* | 6/2016 | Russell | H04R 7/16 381/405 |
| 2016/0363118 A1* | 12/2016 | Sakai | F04B 43/06 |

FOREIGN PATENT DOCUMENTS

| | | |
|---|---|---|
| JP | 5-106615 A | 4/1993 |
| JP | 5-263763 A | 10/1993 |
| JP | 2001147723 A | 5/2001 |

* cited by examiner

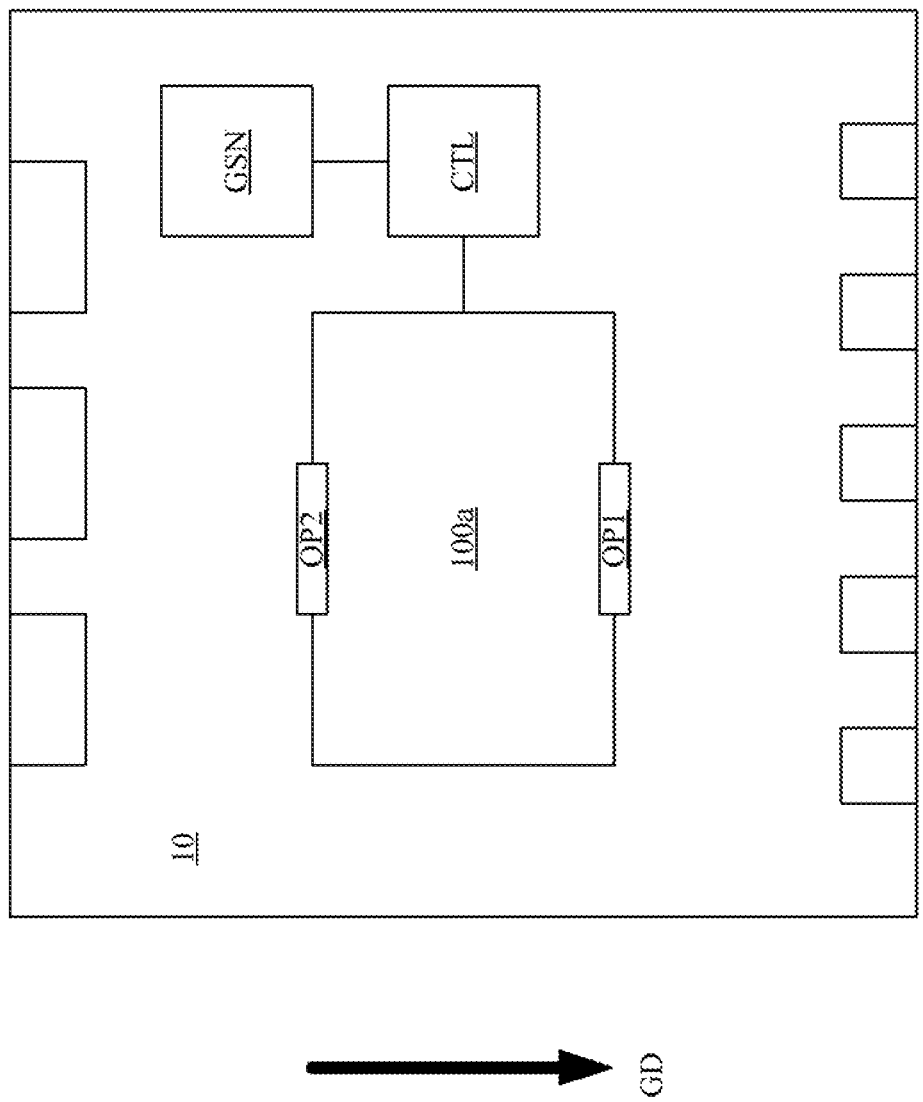

AIRFLOW GENERATING DEVICE AND AIRFLOW GENERATING METHOD

RELATED APPLICATIONS

This application claims priority to Chinese Application Serial Number 201610983163.5, filed Nov. 9, 2016, which is herein incorporated by reference.

BACKGROUND

Field of Invention

The present disclosure relates to an airflow device and a method. More particularly, the present disclosure relates to an airflow generating device and an airflow generating method.

Description of Related Art

With advances in electronic technology, airflow generating devices are widely used in our daily life.

A typical electronic device can dissipate heat thereof by using an airflow generating device, such as a fan. However, the number of different types of applications for the fan is limited due to the noise generated thereby and the lifetime of the motor thereof. Thus, a new airflow generating device is desired.

SUMMARY

One aspect of the present disclosure is related to an airflow generating device. In accordance with one embodiment of the present disclosure, the airflow generating device includes a container, a first air switch, a second air switch, a magnetic oscillating element, and one or more coils. The container has a first opening and a second opening. The first air switch is configured to open or close the first opening. The second air switch is configured to open or close the second opening. The magnetic oscillating element is disposed in the container. The one or more coils are disposed adjacent to the magnetic oscillating element. The one or more coils are configured to generate at least one sensing current corresponding to the oscillation of the magnetic oscillating element, so as to make the first air switch and the second air switch respectively open or close the first opening and the second opening according to the at least one sensing current.

In accordance with one embodiment of the present disclosure, when the magnetic oscillating element is changing a shape thereof toward a first direction, the one or more coils generate a first sensing current, so as to make the first air switch close the first opening according to the first sensing current, and make the second air switch open the second opening according to the first sensing current; and when the magnetic oscillating element is changing the shape thereof toward a second direction, the one or more coils generate a second sensing current, so as to make the first air switch open the first opening according to the second sensing current, and make the second air switch close the second opening according to the second sensing current.

In accordance with one embodiment of the present disclosure, the first air switch comprises a piezoelectric sheet, wherein the piezoelectric sheet bends toward different directions according to the at least one sensing current, so as to open or close the first opening.

In accordance with one embodiment of the present disclosure, the first air switch includes a channel and a resilience cushion. The piezoelectric sheet is disposed within the channel. The resilience cushion is disposed between the channel and the piezoelectric sheet. Under a condition that the piezoelectric sheet open or close the first opening, the piezoelectric sheet is against the channel with the resilience cushion intervened.

In accordance with one embodiment of the present disclosure, the airflow gene rating device includes a switching element configured to selectively change a current path of the at least one sensing current. Under a condition that the switching element is in a switching state, when the magnetic oscillating element is changing a shape thereof toward a first direction, the one or more coils generate a first sensing current, so as to make the first air switch open the first opening according to the first sensing current, and make the second air switch close the second opening according to the first sensing current; and when the magnetic oscillating element is changing the shape thereof toward a second direction, the one or more coils generate a second sensing current, so as to make the first air switch close the first opening according to the second sensing current, and make the second air switch open the second opening according to the second sensing current.

In accordance with one embodiment of the present disclosure, the switching element changes current paths of the first sensing current and the second sensing current corresponding to a gravity direction sensed by a gravity sensor.

In accordance with one embodiment of the present disclosure, the switching element changes current paths of the first sensing current and the second sensing current corresponding to a temperature sensed by at least one thermal sensor.

Another aspect of the present disclosure is related to an airflow generating method. In accordance with one embodiment of the present disclosure, the airflow generating method includes generating, through one or more coils, at least one sensing current corresponding to an oscillation of a magnetic oscillating element disposed in a container; opening, through one of a first air switch and a second air switch, one of a first opening and a second opening of the container according to the at least one sensing current; and closing, through another one of the first air switch and the second air switch, another one of the first opening and the second opening of the container according to the at least one sensing current.

In accordance with one embodiment of the present disclosure, when the magnetic oscillating element is changing a shape thereof toward a first direction, the one or more coils generate a first sensing current, so as to make the first air switch close the first opening according to the first sensing current, and make the second air switch open the second opening according to the first sensing current; and when the magnetic oscillating element is changing the shape thereof toward a second direction, the one or more coils generate a second sensing current, so as to make the first air switch open the first opening according to the second sensing current, and make the second air switch close the second opening according to the second sensing current.

In accordance with one embodiment of the present disclosure, the airflow generating method includes selectively changing a current path of the at least one sensing current. Under a condition that the switching element is in a switching state, when the magnetic oscillating element is changing a shape thereof toward a first direction, the one or more coils generate a first sensing current, so as to make the first air switch open the first opening according to the first sensing current, and make the second air switch close the second opening according to the first sensing current; and when the magnetic oscillating element is changing the shape thereof toward a second direction, the one or more coils generate a second sensing current, so as to make the first air switch close the first opening according to the second sensing current, and make the second air switch open the second opening according to the second sensing current.

Through utilizing one embodiment described above, an airflow generating device can be realized. The openings of the airflow generating device can be opened or closed corresponding to the oscillation of the magnetic oscillating element, so that airflow with certain direction can be generated.

BRIEF DESCRIPTION OF THE DRAWINGS

FIG. 6 illustrates an application of then airflow generating device according to one embodiment of the present disclosure.

DETAILED DESCRIPTION

Figure 1:
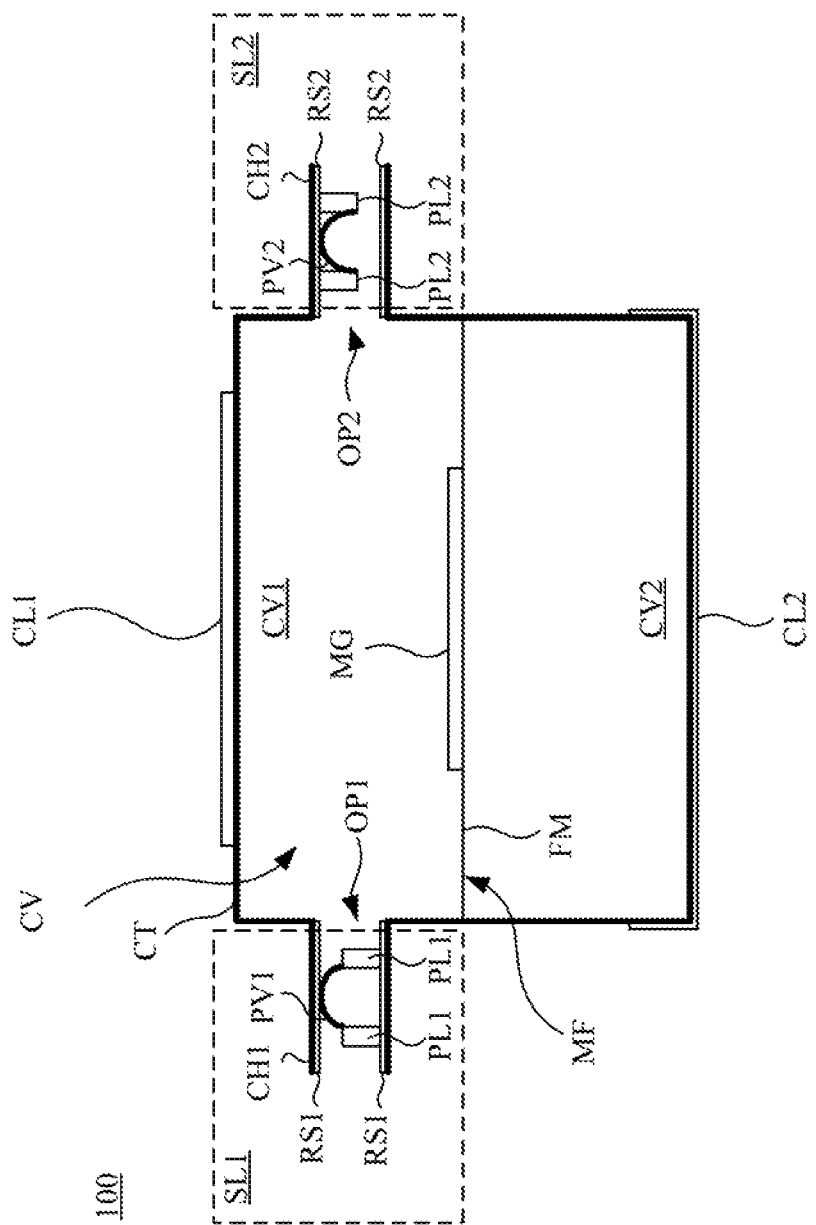
FIG. 1 is a schematic diagram of an airflow generating device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that, although the terms second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

It will be understood that in the description herein and throughout the claims that follow, when an element is referred to as being "connected" or "electrically connected" to another element, it can be directly connected to the other element or intervening elements may be present. In contrast, when an element is referred to as being "directly connected" to another element, there are no intervening elements present. Moreover, "electrically connect" or "connect" can further refer to the interoperation or interaction between two or more elements.

It will be understood that, in the description herein and throughout the claims that follow, the terms "comprise" or "comprising," "include" or "including," "have" or "having," "contain" or "containing" and the like used herein are to be understood to be open-ended, i.e., to mean including but not limited to.

It will be understood that, in the description herein and throughout the claims that follow, the phrase "and/or" includes any and all combinations of one or more of the associated listed items.

It will be understood that, in the description herein and throughout the claims that follow, words indicating direction used in the description of the following embodiments, such as "above," "below," "left," "right," "front" and "back," are directions as they relate to the accompanying drawings. Therefore, such words indicating direction are used for illustration and do not limit the present disclosure.

It will be understood that, in the description herein and throughout the claims that follow, the term "substantially" is used in association with values that may vary slightly, in which such minor errors do not change the properties and the characteristics relevant to the values.

It will be understood that, in the description herein and throughout the claims that follow, unless otherwise defined, all terms (including technical and scientific terms) have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any element in a claim that does not explicitly state "means for" performing a specified function, or "step for" performing a specific function, is not to be interpreted as a "means" or "step" clause as specified in 35 § 112(f). In particular, the use of "step of" in the claim herein is not intended to invoke the provisions of 35 U.S.C. § 112(f).

One aspect of the present disclosure relates to an airflow generating device. In the paragraphs below, a heat dissipation device in an electronic device will be taken as an example to describe details of the airflow generating device. However, another airflow generating device is within the contemplated scope of the present disclosure.

FIG. 1 is a schematic diagram of an airflow generating device 100 according to one embodiment of the present disclosure. In this embodiment, the airflow generating device 100 includes a container CT, a first air switch SL1, a second air switch SL2, a magnetic oscillating element MF, and coils CL1, CL2.

In this embodiment, the container CT has a first opening OP1 and a second opening OP2. In one embodiment, the first opening OP1 is disposed at one side (e.g. a left side) of the container CT and the second opening OP2 is disposed at an opposite side (e.g., a right side) of the container CT. It should be noted that another amount of the openings of the container CT is within the contemplated scope of the present disclosure. Moreover, in alternative embodiments, different openings can also be located at two adjacent sides of the container CT or located at a same side of the container CT. It should be noted that, in this embodiment, a cubic container CT is taken as a descriptive example, but the container CT with a different shape is within the contemplated scope of the present disclosure.

In this embodiment the first air switch SL1 is disposed at the first opening OP1, configured to open or close the first opening OP1. The second air switch is disposed at the second opening OP2, configured to open or close the second opening OP2.

In this embodiment, the magnetic oscillating element MF is disposed in the container CT. In one embodiment, the magnetic oscillating element MF separates the space CV inside the container CT into a first space CV1 and a second space CV2, in which the first space CV1 and the second space CV2 are substantially isolated from each other air-tightly. In one embodiment, the first opening OP1 and the second opening OP2 are connected to the first space CV1. In an alternative embodiment, the first opening OP1 and the second opening OP2 may also be connected to the second space CV2.

In one embodiment, the magnetic oscillating element MF includes an oscillating film FM and a magnetic element MG (e.g., a magnet or an electromagnet). The oscillating film FM is disposed in the container CT, used to substantially separate the first space CV1 and the second space CV2. The magnetic element MG is disposed on the oscillating film FM. In one embodiment, the oscillating film FM may be realized by using piezoelectric material, so as to oscillate according to variations of an electronic signal applied thereto. In another embodiment, the oscillating film FM may oscillate according to variations of a magnetic force between the magnetic element MG and another magnetic element (e.g., a magnet or an electromagnet) (that is, the oscillation of the oscillating film FM is caused by a magnetic force applied to the magnetic element MG). It should be noted that, in one embodiment, there may be multiple magnetic elements MG disposed on the oscillating film FM, and the present disclosure is not limited by the embodiment described above. Additionally, in some alternative embodiments, the oscillating film FM can be realized by using a magnetic film, and the present disclosure is not limited by the embodiment described above.

In this embodiment, the coils CL1, CL2 are disposed adjacent to the magnetic oscillating element MF. In one embodiment, the coil CL1 is disposed at one side of the container CT (e.g., a top side), and the coil CL2 is disposed at an opposite side of the container CT (e.g., a bottom side). In one embodiment, the coils CL1, CL2 may be separately realized, by one or more of a planar coil, a coil with a solid form, or a PCB coil, but another realization manner is within the contemplated scope of the present disclosure. It should be noted that, in this embodiment, the coils CL1, CL2 are disposed outside the container CT. However, the coils CL1, CL2 may be separately disposed inside and/or outside the container CT.

Figure 2:
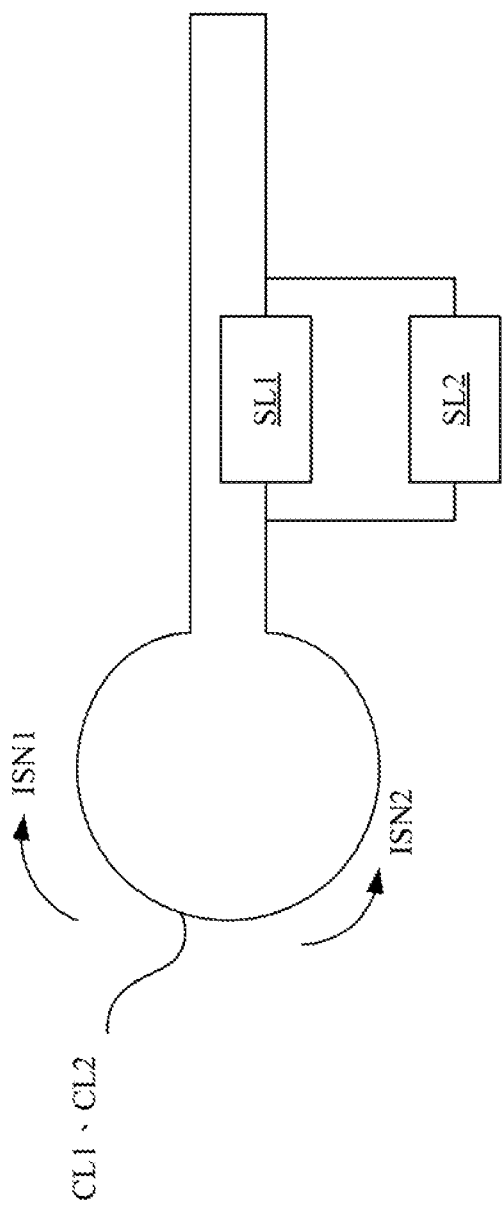
FIG. 2 is a circuit diagram of coils, a first air switch, and a second air switch according to one embodiment of the present disclosure.

Reference is also made to FIG. 2. FIG. 2 is a circuit diagram of coils CL1, CL2, a first air switch SL1, and a second air switch SL2 according to one embodiment of the present disclosure. In one embodiment, when the magnetic oscillating element MF is oscillating (e.g., oscillating based on piezoelectric effect, or oscillating based on variations of a magnetic force between the magnetic element MG and another magnetic element (e.g., a magnet or an electromagnet)), the coils CL1, CL2 are configured to generate sensing currents ISN1, ISN2 corresponding to the oscillation of the magnetic oscillating element MF, so as to make the first air switch SL1 and the second air switch SL2 respectively open or close the first opening OP1 and the second opening OP2 according to the sensing currents ISN1, ISN2.

For example, when the magnetic oscillating element MF is changing the shape thereof toward a first direction (e.g., toward an up direction), the coils CL1, CL2 generate the first sensing current ISN1, so as to make the first air switch SL1 close the first opening OP1 according to the first sensing current ISN1, and make the second air switch SL2 open the second opening OP2 according to the first sensing current ISN1. In this period, the first spacing CV1 is being compressed and the second spacing CV2 is being expanded, so that the airflow generating device 100 blows air by using the second opening OP2.

When the magnetic oscillating element MF is changing the shape thereof toward a second direction (e.g., toward a down direction), the coils CL1, CL2 generate the second sensing current ISN2 (a current direction of the second sensing current ISN2 is different from the first sensing current ISN1), so as to make the first air switch SL1 open the first opening OP1 according to the second sensing current ISN2, and make the second air switch SL2 close the second opening OP2 according to the second sensing current ISN2. In this period, the first spacing CV1 is being expanded and the second spacing CV2 is being compressed, so that the airflow generating device 100 sucks air by using the first opening OP1.

With such a configuration, an airflow generating device can be realized. The openings of the airflow generating device can be opened or closed corresponding to the oscillation of the magnetic oscillating element, so that an airflow with certain direction (e.g., from the first opening OP1 to the second opening) can be generated.

In one embodiment, the first opening OP1 and the second opening OP2 are not closed concurrently. When the second opening OP2 is closed, the first opening OP1 is opened, and when the first opening OP1 is closed, the second opening OP2 is opened.

In one embodiment, the first air switch SL1 open or close the first opening OP1 corresponding to the first space CV1 is being compressed or expanded. In one embodiment, the second air switch SL2 open or close the second opening OP2 corresponding to the first space CV1 is being compressed or expanded.

In one embodiment, the first air switch SL1 includes a piezoelectric sheet PV1, pillars PL1, and a channel CH1. In one embodiment, the piezoelectric sheet PV1 and the pillars PL1 are disposed within the channel CH1. In one embodiment, the pillars PL1 are disposed at the bottom side of the channel CH1. Two ends of the piezoelectric sheet PV1 are separately disposed at the pillars PL1. In one embodiment, the piezoelectric sheet PV1 bends toward different directions according to the sensing currents ISN1, ISN2, so as to open or close the first opening OP1. For example, the piezoelectric sheet PV1 may bend upward according to the first sensing current ISN1 to close the first opening OP1, and the piezoelectric sheet PV1 may bend downward according to the second sensing current ISN2 to open the first opening OP1. It should be noted that the pillars PL1 can be disposed at the top side or the bottom side of the channel CH1 on a basis of actual requirements, and the present disclosure is not limited by this embodiment.

In one embodiment, the first air switch SL1 further includes a resilience cushion RS1 disposed between the channel CH1 and the piezoelectric sheet PV1. In one embodiment, the resilience cushion RS1 can be disposed at the top side and/or the bottom side of the channel CH1. Under a condition that the piezoelectric sheet PV1 open or close the first opening OP1 the piezoelectric sheet PV1 is against the channel CH1 with the resilience cushion RS1 intervened, so as to avoid abrasions of the piezoelectric sheet PV1 and the channel CH1.

In one embodiment, the second air switch SL2 includes a piezoelectric sheet PV2, pillars PL2, and a channel CH2. In one embodiment, the piezoelectric sheet PV2 and the pillars PL2 are disposed within the channel CH2. In one embodiment, the pillars PL2 are disposed at the top side of the channel CH2. Two ends of the piezoelectric sheet PV2 are separately disposed at the pillars PL2. In one embodiment, the piezoelectric sheet PV2 bends toward different directions according to the sensing currents ISN1, ISN2, so as to open or close the second opening OP2. For example, the piezoelectric sheet PV2 may bend upward according to the first sensing current ISN1 to open the second opening OP2, and the piezoelectric sheet PV2 may bend downward according to the second sensing current ISN2 to close the second opening OP2. It should be noted that the pillars PL2 can be disposed at the top side or the bottom side of the channel CH2 on a basis of actual requirements, and the present disclosure is not limited by this embodiment.

In one embodiment, the second air switch SL2 further includes a resilience cushion RS2 disposed between the channel CH2 and the piezoelectric sheet PV2. In one embodiment, the resilience cushion RS2 can be disposed at the top side and/or the bottom side of the channel CH2. Under a condition that the piezoelectric sheet PV2 open or close the second opening OP2, the piezoelectric sheet PV2 is against the channel CH2 with the resilience cushion RS2 intervened, so as to avoid abrasions of the piezoelectric sheet PV2 and the channel CH2.

To allow the disclosure to be more fully understood, an operative example is described in the paragraphs below but the present disclosure is not limited to the example below.

Figure 3A:
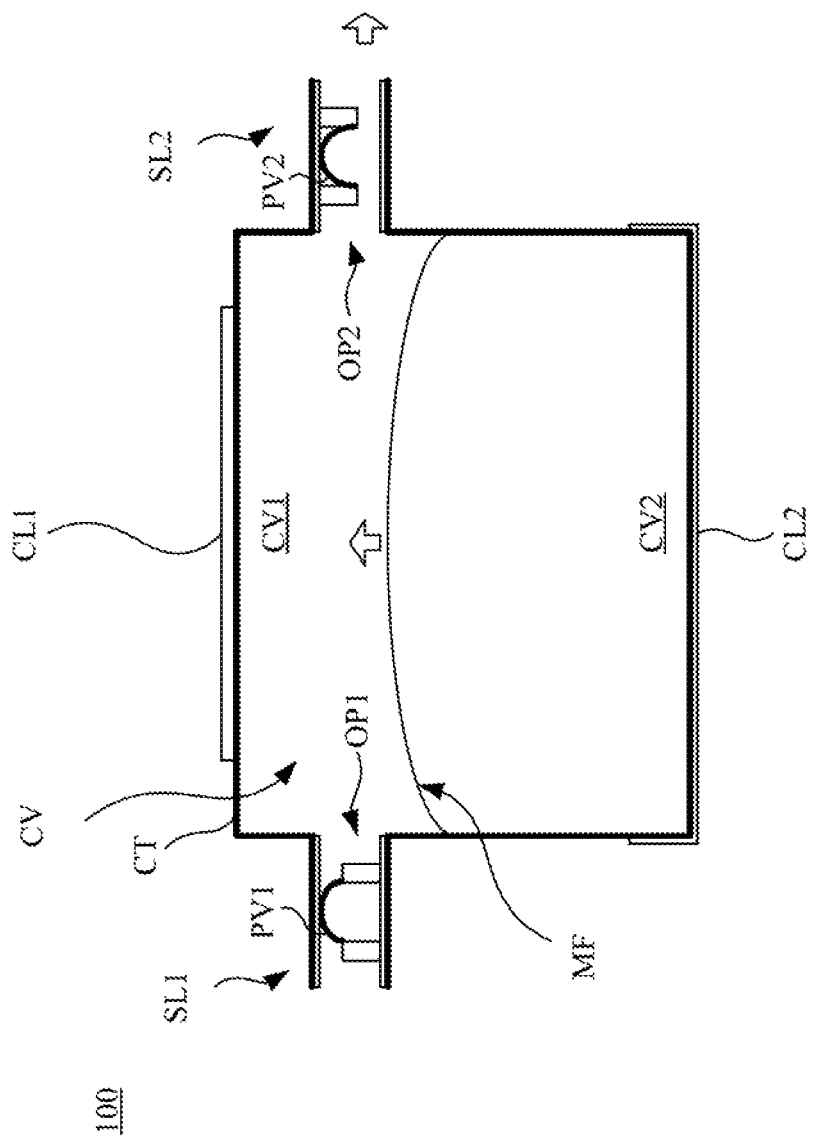
FIG. 3A illustrates an operative example of the airflow generating device is according to one embodiment of the present disclosure.

Reference is made to FIG. 3A. When the magnetic oscillating element MF is changing the shape thereof upward, the coils CL1, CL2 generate the first sensing current ISN1. The piezoelectric sheet PV1 bends upward according to the first sensing current ISN1 to close the first opening OP1. The piezoelectric sheet PV2 bends upward according to the first sensing current ISN1 to open the second opening OP2. During this period, since the first space CV1 is being compressed, the airflow generating device 100 blows air by using the opened second opening OP2.

Figure 3B:
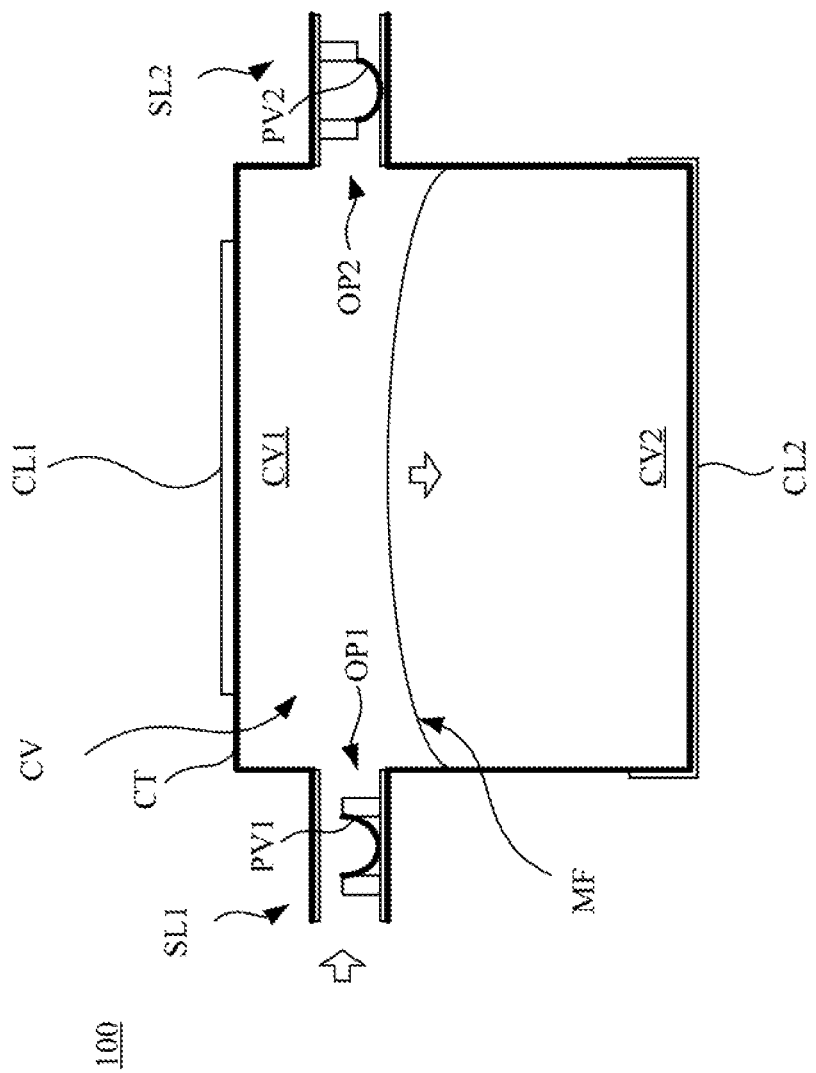
FIG. 3B illustrates an operative example of the airflow generating device is according to one embodiment of the present disclosure.

Reference is made to FIG. 3B. When the magnetic oscillating element MF is changing the shape thereof downward, the coils CL1, CL2 generate the second sensing current ISN2. The piezoelectric sheet PV1 bends downward according to the second sensing current ISN2 to open the first opening OP1. The piezoelectric sheet PV1 bends downward according to the second sensing current ISN2 to close the second opening OP2. During this period, since the first space CV1 is being expanded, the airflow generating device 100 sucks air by using the opened first opening OP1.

Figure 3C:
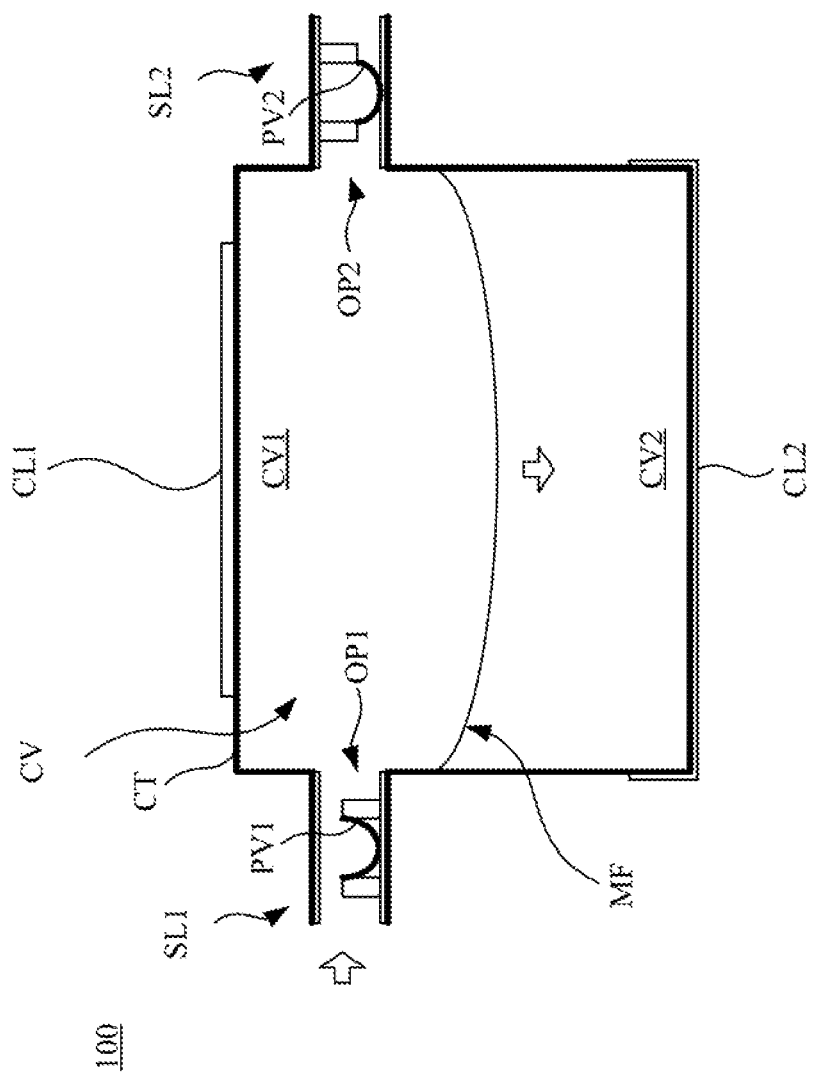
FIG. 3C illustrates an operative example of the airflow generating device is according to one embodiment of the present disclosure.

Reference is made to FIG. 3C. When the magnetic oscillating element MF is changing the shape thereof downward, the coils CL1, CL2 generate the second sensing current ISN2. The piezoelectric sheet PV1 bends downward according to the second sensing current ISN2 to open the first opening OP1. The piezoelectric sheet PV2 bends downward according to the second sensing current ISN2 to close the second opening OP2. During this period, since the first space CV1 is being expanded, the airflow generating device 100 sucks air by using the opened first opening OP1.

Figure 3D:
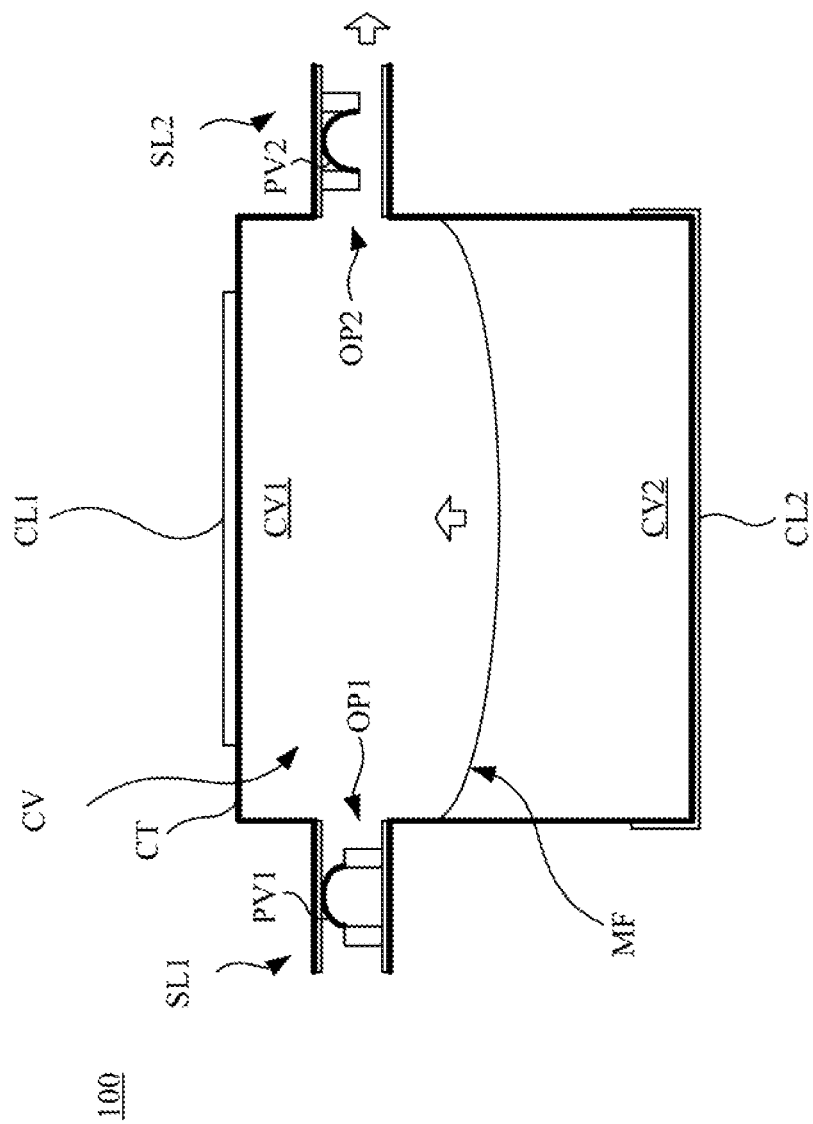
FIG. 3D illustrates an operative example of the airflow generating device is according to one embodiment of the present disclosure.

Reference is made to FIG. 3D. When the magnetic oscillating element MF is changing the shape thereof upward, the coils CL1, CL2 generate the first sensing current ISN1. The piezoelectric sheet PV1 bends upward according to the first sensing current ISN1 to close the first opening OP1. The piezoelectric sheet PV2 bends upward according to the first sensing current ISN1 to open the second opening OP2. During this period, since the first space CV1 is being compressed, the airflow generating device 100 blows air by using the opened second opening OP2.

Through the operations described above, the airflow generating device 100 can suck air by using the first opening OP1 and blow air by using the opened second opening OP2. In such a manner, airflow with a fixed direction can be generated and it can avoid hot air to be sucked back into the airflow generating device 100 to decrease the heat dissipation efficiency.

Figure 4:
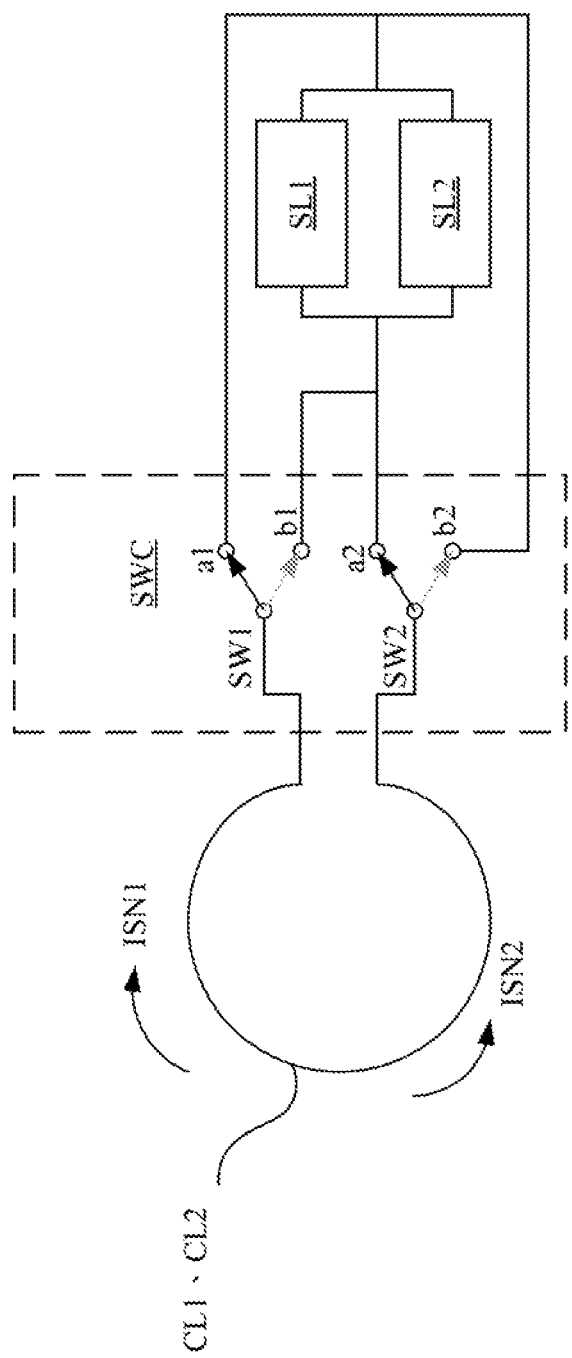
FIG. 4 is a circuit diagram of coils, a first air switch, and a second air switch according to another embodiment of the present disclosure.

Reference is made to FIG. 4. In another embodiment of the present disclosure, in addition to the container CT, the first air switch SL1, the second air switch SL2, the magnetic oscillating element MF, and the coils CL1, CL2 described above, an airflow generating device 100a further includes a switching element SWC. Operations and dispositions of the container CT, the first air switch SL1, the second air switch SL2, the magnetic oscillating element MF, and the coils CL1, CL2 in airflow generating device 100a are substantially identical to the container CT, the first air switch SL1, the second air switch SL2, the magnetic oscillating element MF, and the coils CL1, CL2 in airflow generating device 100, and a description in this regard will not be repeated herein.

In this embodiment, the switching element SWC is disposed between the coils CL1, CL2, the first air switch SL1, and the second air switch SL2, configured to selectively change current paths of the sensing currents ISN1, ISN2. In one embodiment, the switching element SWC is configured to selectively change directions of the sensing currents ISN1, ISN2 passing through the first air switch SL1 and the second air switch SL2.

In one embodiment, the switching element SWC may include switch SW1 and switch SW2. The switch SW1 is electrically connected between the coils CL1, CL2 and the first air switch SL1. The switch SW2 is electrically connected between the coils CL1, CL2 and the second air switch SL2. Under a condition that the switching element SWC is in a first switching state the switch SW1 connects point a1, and the switch SW2 connects point a2. At this time, the current directions of the sensing currents ISN1, ISN2 passing through the first air switch SL1 and the second air switch SL2 are identical to the current directions of the sensing currents ISN1, ISN2 passing through the first air switch SL1 and the second air switch SL2 as shown in FIG. 2.

That is, when the magnetic oscillating element MF is changing the shape thereof toward a first direction (e.g., a up direction), the coils CL1, CL2 generate the first sensing current ISN1, so as to make the first air switch SL1 close the first opening OP1 according to the first sensing current ISN1, and make the second air switch SL2 open the second opening OP2 according to the first sensing current ISN1. When the magnetic oscillating element MF is changing the shape thereof toward a second direction (e.g., a down direction), the coils CL1, CL2 generate the second sensing current ISN2, so as to make the first air switch SL1 open the first opening OP1 according to the second sensing current ISN2, and make the second air switch SL2 close the second opening OP2 according to the second sensing current ISN2.

Under a condition that the switching element SWC is in a second switching state, the switch SW1 connects point b1, and the switch SW2 connects point b2. At this time, the current directions of the sensing currents ISN1, ISN2 passing through the first air switch SL1 and the second air switch SL2 are opposite to the current directions of the sensing currents ISN1, ISN2 passing through the first air switch SL1 and the second air switch SL2 as shown in FIG. 2.

That is, when the magnetic oscillating element MF is changing the shape thereof toward a first direction (e.g., a up direction), the coils CL1, CL2 generate the first sensing current ISN1, so as to make the first air switch SL1 open the first opening OP1 according to the first sensing current ISN1, and make the second air switch SL2 close the second opening OP2 according to the first sensing current ISN1. When the magnetic oscillating element MF is changing the shape thereof toward a second direction (e.g., a down direction), the coils CL1, CL2 generate the second sensing current ISN2, so as to make the first air switch SL1 close the first opening OP1 according to the second sensing current ISN2, and make the second air switch SL2 open the second opening OP2 according to the second sensing current ISN2.

To allow the disclosure to be more fully understood, an operative example relating to operations of the airflow generating device 100a under the second switching state is described in the paragraphs below (the operations of the airflow generating device 100a under the first switching state can be ascertained with reference to the paragraphs corresponding to FIG. 3A-FIG. 3D), but the present disclosure is not limited to the example below.

Figure 5A:
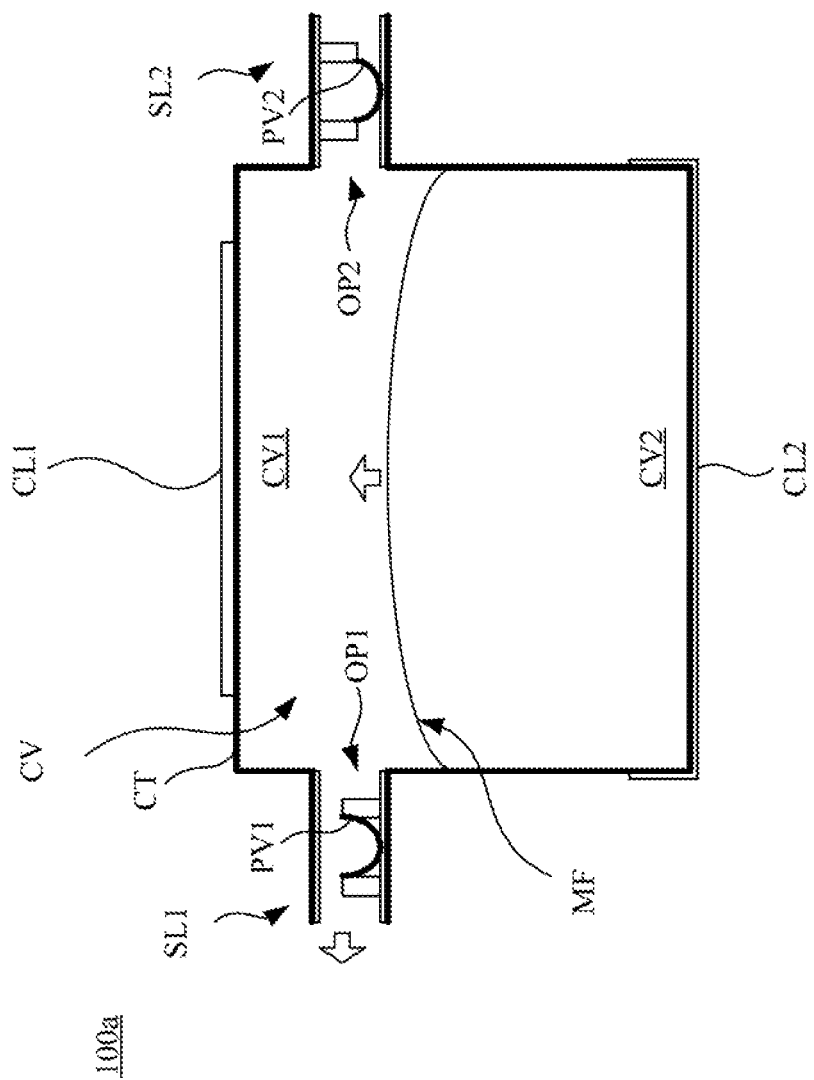
FIG. 5A illustrates an operative example of the airflow generating device according to another embodiment of the present disclosure.

Reference made to FIG. 5A. When the magnetic oscillating element MF is changing the shape thereof upward, the coils CL1, CL2 generate the first sensing current ISN1. The piezoelectric sheet PV1 bends downward according to the first sensing current ISN1 to open the first opening OP1. The piezoelectric sheet PV2 bends downward according to the first sensing current ISN1 to close the second opening OP2. During this period, since the first space CV1 is being compressed, the airflow generating device 100 blows air by using the opened first opening OP1.

Figure 5B:
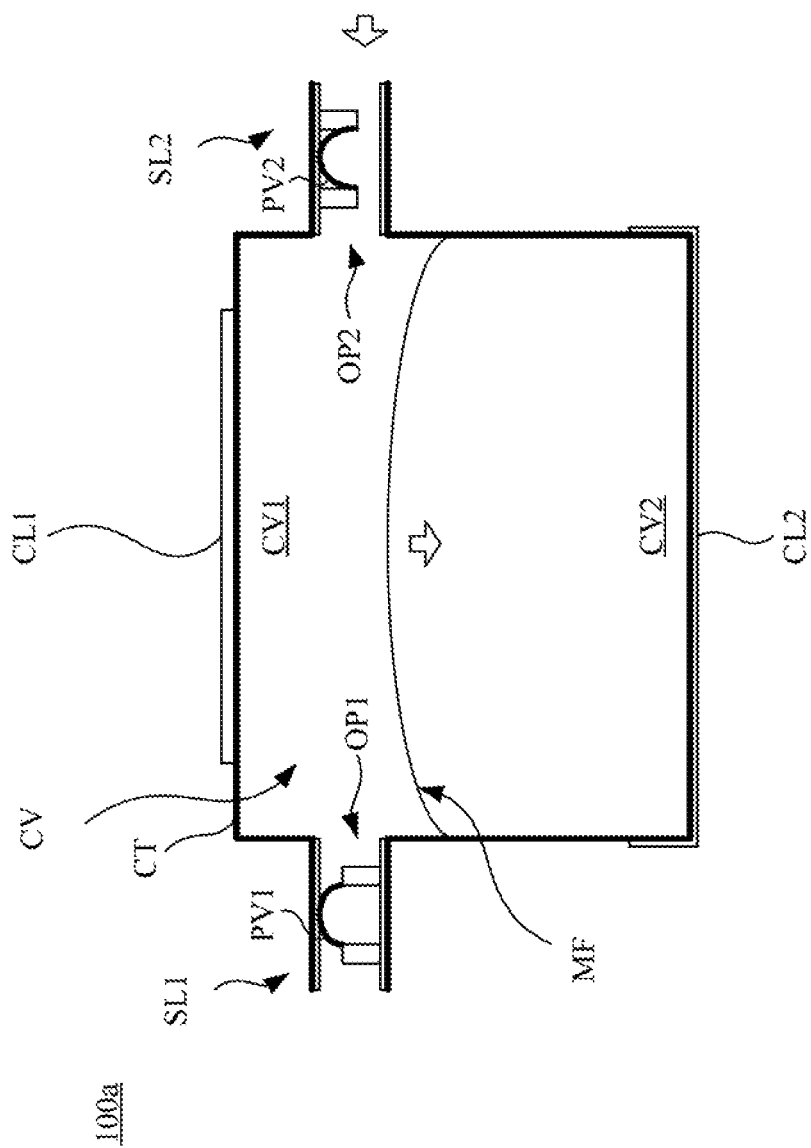
FIG. 5B illustrates an operative example of the airflow generating device is according to another embodiment of the present disclosure.

Reference is made to FIG. 5B. When the magnetic oscillating element MF is changing the shape thereof downward, the coils CL1, CL2 generate the second sensing current ISN2. The piezoelectric sheet PV1 bends upward according to the second sensing current ISN2 to close the first opening OP1. The piezoelectric sheet PV2 bends upward according to the second sensing current ISN2 to open the second opening OP2. During this period, since the first space CV1 is being expanded, the airflow generating device 100 sucks air by using the opened second opening OP2.

Figure 5C:
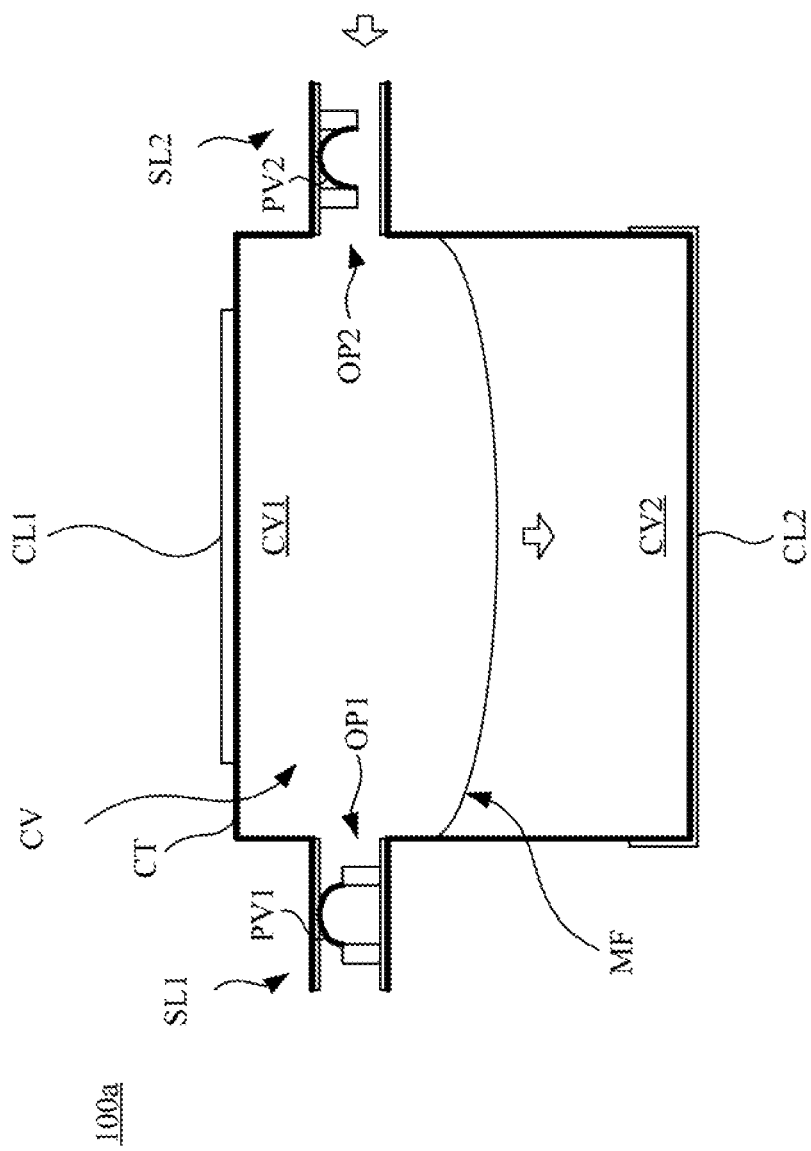
FIG. 5C illustrates an operative example of the airflow generating device according to another embodiment of the present disclosure.

Reference is made to FIG. 5C. When the magnetic oscillating element MF is changing the shape thereof downward, the coils CL1, CL2 generate the second sensing current ISN2. The piezoelectric sheet PV1 bends upward according to the second sensing current ISN2 to close the first opening OP1. The piezoelectric sheet PV2 bends upward according to the second sensing current ISN2 to open the second opening OP2. During this period, since the first space CV1 is being expanded, the airflow generating device 100 sucks air by using the opened second opening OP2.

Figure 5D:
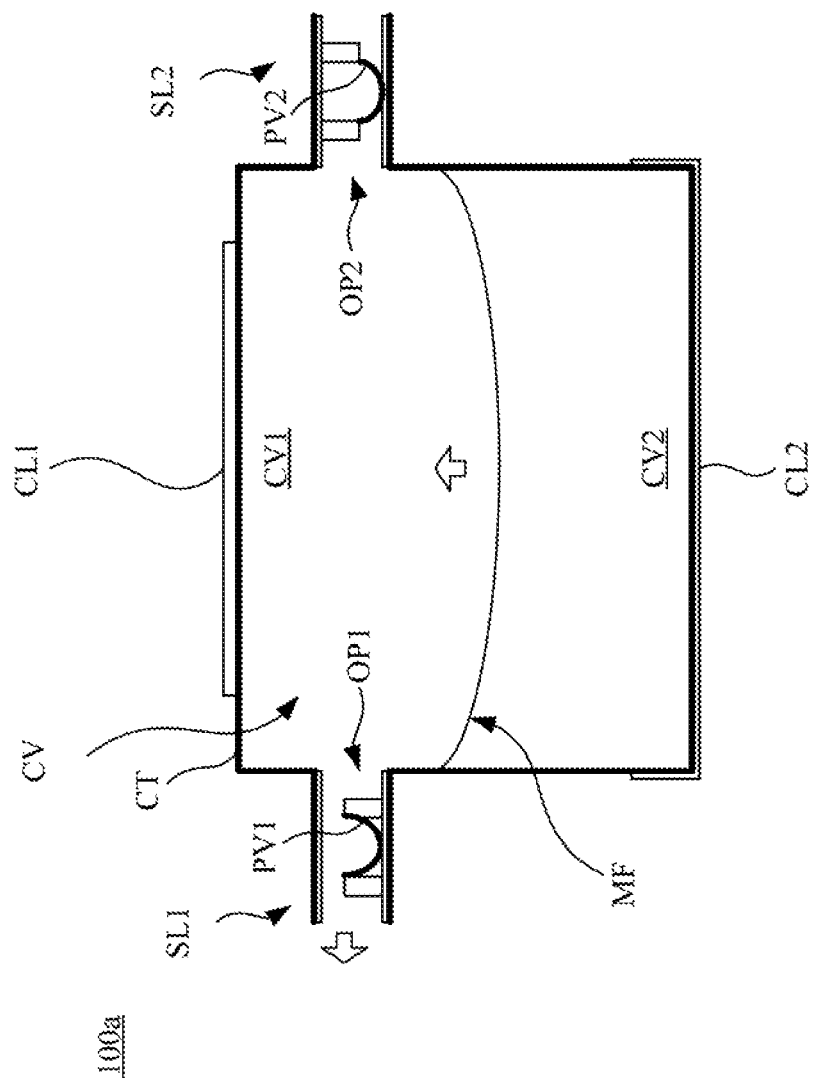
FIG. 5D illustrates an operative example of the airflow generating device is according to another embodiment of the present disclosure.

Reference is made to FIG. 5D. When the magnetic oscillating element MF is changing the shape thereof upward, the coils CL1, CL2 generate the first sensing current ISN1. The piezoelectric sheet PV1 bends downward according to the first sensing current ISN1 to open the first opening OP1. The piezoelectric sheet PV2 bends downward according to the first sensing current ISN1 to close the second opening OP2. During this period, since the first space CV1 is being compressed, the airflow generating device 100 blows air by using the opened first opening OP1.

Through the operations described above, the airflow generating device 100a can blows air by using the first opening OP1 and suck air by using the opened second opening OP2. In such a manner, the airflow generating device 100a can have an expanded number of applications Reference is made to FIG. 6. In one embodiment, the airflow generating device 100a can be disposed in an electronic device 10. In one embodiment, the electronic device 10 further includes a controller CTL and a gravity sensor GSN. The controller CTL is electrically connected to the airflow generating device 100a and the gravity sensor GS. The controller CTL can be realized by, for example, a central processor (CPU), a microprocessor, a programmable logic device (PLD), a field-programmable gate array (FPGA) or another suitable processing component.

In one embodiment, the controller CTL can control the switching element SWC to switch to the first switching state or the second switching state described above according to a gravity direction GD sensed by the gravity sensor GSN. That is, the switching element SWC changes current paths of the first sensing current ISN1 and the second sensing current ISN2 according to the gravity direction GD sensed by the gravity sensor GSN, and changes current directions of the first sensing current ISN1 and the second sensing current ISN2 passing through the first air switch SL1 and the second air switch SL2 according to the gravity direction GD sensed by the gravity sensor GSN. In one embodiment, the controller CTL can control the switching element SWC to switch to the first switching state or the second switching state described above according to the gravity direction GD sensed by the gravity sensor GSN, so as to make the airflow generating device 100a generate airflow with a direction substantially opposite to the gravity direction GD to facilitate heat dissipation of the electronic device 10.

For example, in one embodiment, when the electronic device 10 is upright, the facing direction of the first opening OP1 (e.g., facing the down direction) is substantially identical to the gravity direction GD, and the facing direction of the second opening OP2 (e.g., facing the up direction) is substantially opposite to the gravity direction GD. The controller CTL can control the switching element SWC to switch to the first switching state described above according to the gravity direction GD sensed by the gravity sensor GSN, so that the airflow generating device 100a sucks air by using the first opening OP1, and blows air by using the second opening OP2, so as to generate airflow with a direction substantially opposite to the gravity direction GD.

For another example, in one embodiment, when the electronic device 10 is disposed upside down, the facing direction of the first opening OP1 (e.g., facing the up direction) is substantially opposite to the gravity direction GD, and the facing direction of the second opening OP2

(e.g., facing the down direction) is substantially identical to the gravity direction GD. The controller CTL can control the switching element SWC to switch to the second switching state described above according to the gravity direction GD sensed by the gravity sensor GSN, so that the airflow generating device 100*a* sucks air by using the second opening OP2, and blows air by using the first opening OP1, so as to generate airflow with a direction substantially opposite to the gravity direction GD.

Figure 7:
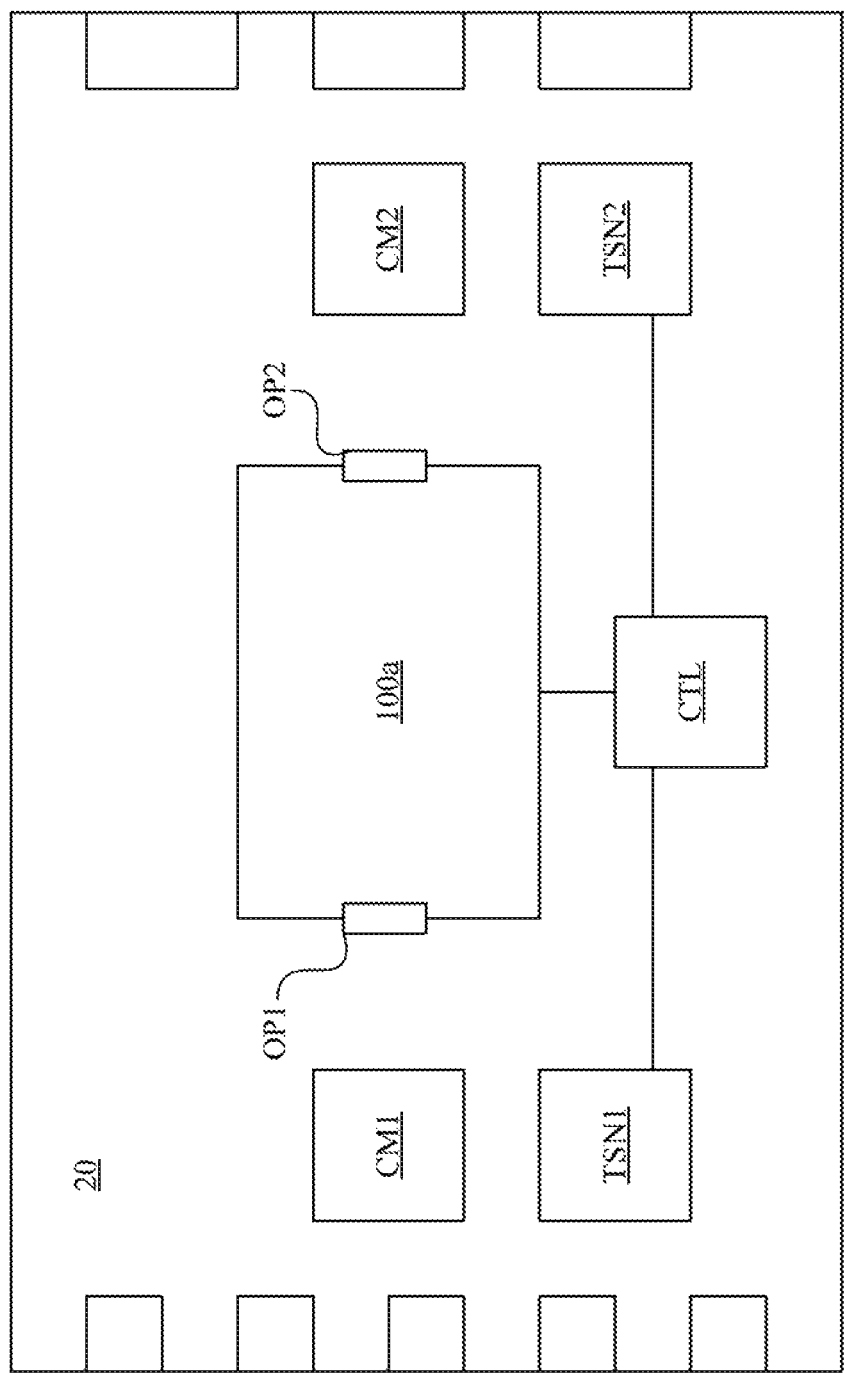
FIG. 7 illustrates an application of then airflow generating device according to another embodiment of the present disclosure.

Reference is made to FIG. 7. In one embodiment, the airflow generating device 100*a* can be disposed in an electronic device 20. In one embodiment, the electronic device 20 further includes a controller CTL, electronic components CM1, CM2, and thermal sensors TSN1, TSN2. In one embodiment, the thermal sensors TSN1, TSN2 are respectively disposed adjacent to the electronic components CM1, CM2, and respectively configured to sensing the temperatures of the electronic components CM1, CM2. The controller CTL is electrically connected to the airflow generating device 100*a* and the thermal sensors TSN1, TSN2. The controller CTL can be realized by, for example, a central processor (CPU), a microprocessor, a programmable logic device (PLD), a field-programmable gate array (FPGA) or another suitable processing component.

In one embodiment, the controller CTL can control the switching element SWC to switch to the first switching state or the second switching state described above according to the temperatures sensed by the thermal sensors TSN1, TSN2. That is, the switching element SWC changes current paths of the first sensing current ISN1 and the second sensing current ISN2 according to the temperatures sensed by the thermal sensors TSN1, TSN2, and changes current directions of the first sensing current ISN1 and the second sensing current ISN2 passing through the first air switch SL1 and the second air switch SL2 according to the temperatures sensed by the thermal sensors TSN1, TSN2. In one embodiment, the controller CTL can control the switching element SWC to switch to the first switching state or the second switching state described above according to the temperatures sensed by the thermal sensors TSN1, TSN2, so as to make the airflow generating device 100*a* generate airflow with a direction toward one of the electronic components CM1, CM2 having a higher temperature, to facilitate heat dissipation of one of the electronic components CM1, CM2 having a higher temperature.

For example, in one embodiment, the first opening OP1 is facing toward the electronic component CM1 and the second opening OP2 is facing toward the electronic component CM2. The thermal sensor TSN1 is disposed adjacent to the electronic component CM1, configured to sense the temperature of the electronic component CM1. The thermal sensor TSN2 is disposed adjacent to the electronic component CM2, configured to sense the temperature of the electronic component CM2. Under a condition that the temperature sensed by the thermal sensor TSN1 is lower than the temperature sensed by the thermal sensor TSN2, the controller CTL can correspondingly control the switching element SWC to switch to the first switching state described above, so that the airflow generating device 100*a* sucks air by using the first opening OP1, and blows air by using the second opening OP2, so as to generate airflow blowing to the electronic component CM2. On the other hand, under a condition that the temperature sensed by the thermal sensor TSN1 is greater than the temperature sensed by the thermal sensor TSN2, the controller CTL can correspondingly control the switching element SWC to switch to the second switching state described above, so that the airflow generating device 100*a* sucks air by using the second opening OP2, and blows air by using the first opening OP1, so as to generate airflow blowing to the electronic component CM1.

For another example, in one embodiment, the first opening OP1 is facing toward the electronic component CM1, and the second opening OP2 is facing toward the electronic component CM2. The thermal sensor TSN2 is disposed adjacent to the electronic component CM1, configured to sense the temperature of the electronic component CM1. The thermal sensor TSN2 is disposed adjacent to the electronic component CM2, configured to sense the temperature of the electronic component CM2. In one embodiment, under a condition that the temperature sensed by the thermal sensor TSN2 is greater than a predetermined threshold, the controller CTL can correspondingly control the switching element SWC to switch to the first switching state described above, so that the airflow generating device 100*a* sucks air by using the first opening OP1, and blows air by using the second opening OP2, so as to generate airflow blowing to the electronic component CM2. In one embodiment, under a condition that the temperature sensed by the thermal sensor TSN1 is greater than a predetermined threshold, the controller CTL can correspondingly control the switching element SWC to switch to the second switching state described above, so that the airflow generating device 100*a* sucks air by using the second opening OP2, and blows air by using the first opening OP1, so as to generate airflow blowing to the electronic component CM1.

Details of the present disclosure are described in the paragraphs below with reference to an airflow generating method in FIG. 8. However, the present disclosure is not limited to the embodiment below.

It should be noted that the airflow generating method can be applied to an airflow generating device having a structure that is the same as or similar to the structure of the mobile device 100 shown in FIG. 1. To simplify the description below, the embodiment shown in FIG. 1 will be used as an example to describe the airflow generating method according to an embodiment of the present disclosure. However, the present disclosure is not limited to application to the embodiment shown in FIG. 1. The airflow generating method can also be applied to the airflow generating device 100*a*.

In addition, it should be noted that in the operations of the following airflow generating method, no particular sequence is required unless otherwise specified. Moreover, the following operations also may be performed simultaneously or the execution times thereof may at least partially overlap.

Furthermore, the operations of the following airflow generating method may be added to, replaced, and/or eliminated as appropriate, in accordance with various embodiments of the present disclosure.

Figure 8:
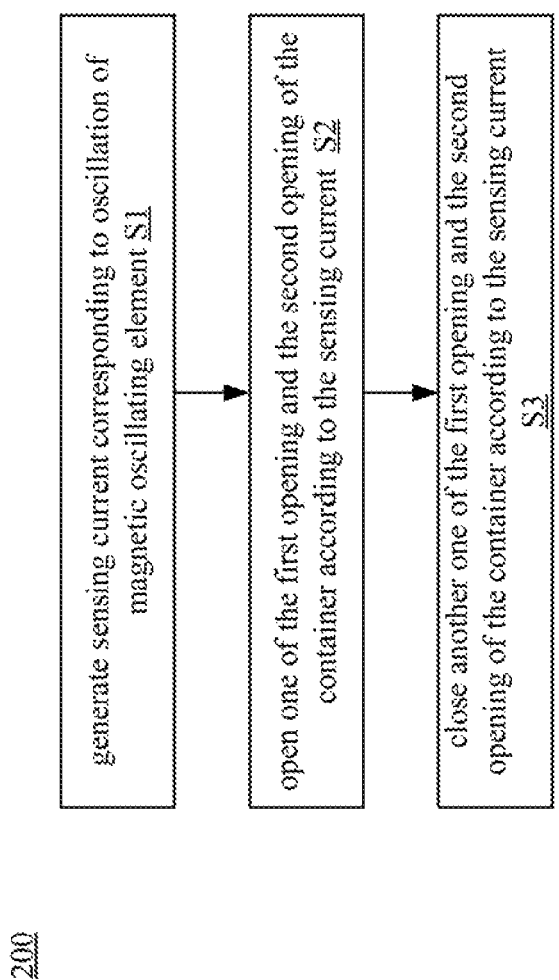
FIG. 8 is a flowchart of an airflow generating r method according to one embodiment of the present disclosure.

Reference is made to FIG. 8. The airflow generating method 200 includes the operations below.

In operation S1, the airflow generating device 100 generates at least one of the sensing currents ISN1, ISN2 corresponding to the oscillation of the magnetic oscillating element MF disposed in the container CT by using the coils CL1, CL2.

In operation S2, the airflow generating device 100 opens one of the first opening OP1 and the second opening OP2 of the container CT according to the at least one of the sensing currents ISN1, ISN2 by using one of the first air switch SL1 and the second air switch SL2.

In operation S3, the airflow generating device 100 closes another one of the first opening OP1 and the second opening OP2 of the container CT according to the at least one of the sensing currents ISN1, ISN2 by using another one of the first air switch SL1 and the second air switch SL2. In one embodiment, operations S2, S3 can be executed concurrently.

It should be noted that details of the operations described above can be ascertained with reference to the embodiments described above, and a description in this regard will not be repeated herein.

Through the operations described above, the openings of the airflow generating device can be opened or closed corresponding to the oscillation of the magnetic oscillating element, so that airflow with certain direction can be generated.

Although the present disclosure has been described in considerable detail with reference to certain embodiments thereof, other embodiments are possible. Therefore, the scope of the appended claims should not be limited to the description of the embodiments contained herein.

What is claimed is:

1. An airflow generating device comprising:
    a container having a first opening and a second opening;
    a first air switch configured to open or close the first opening;
    a second air switch configured to open or close the second opening;
    a magnetic oscillating element disposed in the container;
    one or more coils disposed adjacent to the magnetic oscillating element; and
    a switching element configured to selectively change a current path of at least one sensing current;
    wherein the one or more coils are configured to generate the at least one sensing current corresponding to an oscillation of the magnetic oscillating element, so as to make the first air switch and the second air switch respectively open or close the first opening and the second opening according to the at least one sensing current,
    wherein under a condition that the switching element is in a switching state, when the magnetic oscillating element is changing a shape thereof toward a first direction, the one or more coils generate a first sensing current, so as to make the first air switch open the first opening according to the first sensing current, and make the second air switch close the second opening according to the first sensing current, and when the magnetic oscillating element is changing the shape thereof toward a second direction, the one or more coils generate a second sensing current, so as to make the first air switch close the first opening according to the second sensing current, and make the second air switch open the second opening according to the second sensing current;
    wherein the switching element changes the current paths of the first sensing current and the second sensing current corresponding to a gravity direction sensed by a gravity sensor.

2. The airflow generating device as claimed in claim 1, wherein the first air switch comprises a piezoelectric sheet, wherein the piezoelectric sheet bends toward different directions according to the at least one sensing current, so as to open or close the first opening.

3. An airflow generating method comprising:
    generating, through one or more coils, at least one sensing current corresponding to an oscillation of a magnetic oscillating element disposed in a container;
    opening, through one of a first air switch and a second air switch, one of a first opening and a second opening of the container according to the at least one sensing current;
    closing, through another one of the first air switch and the second air switch, another one of the first opening and the second opening of the container according to the at least one sensing current; and
    selectively changing a current path of the at least one sensing current;
    wherein under a condition that a switching element is in a switching state, when the magnetic oscillating element is changing a shape thereof toward a first direction, the one or more coils generate a first sensing current, so as to make the first air switch open the first opening according to the first sensing current, and make the second air switch close the second opening according to the first sensing current, and when the magnetic oscillating element is changing the shape thereof toward a second direction, the one or more coils generate a second sensing current, so as to make the first air switch close the first opening according to the second sensing current, and make the second air switch open the second opening according to the second sensing current,
    wherein the switching element changes the current paths of the first sensing current and the second sensing current corresponding to a gravity direction sensed by a gravity sensor.

* * * * *